United States Patent [19]

Yoldas et al.

[11] 4,293,594
[45] Oct. 6, 1981

[54] METHOD FOR FORMING CONDUCTIVE, TRANSPARENT COATING ON A SUBSTRATE

[75] Inventors: Bulent E. Yoldas, Churchill; Douglas M. Mattox, Forest Hills, both of Pa.

[73] Assignee: Westinghouse Electric Corp., Pittsburgh, Pa.

[21] Appl. No.: 180,768

[22] Filed: Aug. 22, 1980

[51] Int. Cl.$^3$ .................. B05D 7/22; B05D 5/12; C03C 17/245

[52] U.S. Cl. ................................ 427/107; 427/66; 427/67; 427/109; 427/160; 427/163; 427/166; 427/235; 427/237

[58] Field of Search .............. 427/66, 67, 107, 109, 427/160, 163, 166, 235, 237

[56] References Cited

U.S. PATENT DOCUMENTS 3,949,146  4/1976  Kane et al. ............... 427/109 X
4,146,657  3/1979  Gordon ..................... 427/109

FOREIGN PATENT DOCUMENTS 39-20121  9/1964  Japan .
42-26637  12/1967  Japan .
44-4211  2/1969  Japan .
50-8590  4/1975  Japan .
50-8863  4/1975  Japan .

OTHER PUBLICATIONS

Fraser et al., "Highly Conductive, Transparent Films of Sputtered $In_{2-x}Sn_xO_{3-y}$", *J. Electrochem Soc., Solid State Sci. and Tech.*, vol. 119, No. 10, Oct. 1972, pp. 1368-1374.

*Primary Examiner*—James R. Hoffman
*Attorney, Agent, or Firm*—W. D. Palmer

[57] ABSTRACT

Method for forming conductive, transparent coating such as may be used on the interior surface of a vitreous tubular member. In a carrier gas and exterior to the member to be coated, there is formed a vapor from a material substantially comprising organic tin halide compound having a predetermined condensation temperature and a predetermined decomposition temperature, with the temperature of the carrier gas and the formed vapor maintained between these temperatures. The member to be coated is heated to a temperature greater than the decomposition temperature of the organic tin halide compound and the heated carrier gas and formed vapor are longitudinally flowed through the heated tubular member. Upon contact with the heated tubular member, the vapor breaks down to form the transparent conducting coating. The carrier gas and residual heated vapor are flowed out of the member being coated and are cooled to condense and collect the residual material. There are also provided very high performance fluorine-doped tin oxide coatings.

12 Claims, 4 Drawing Figures

METHOD FOR FORMING CONDUCTIVE, TRANSPARENT COATING ON A SUBSTRATE

BACKGROUND OF THE INVENTION

This invention relates to method for forming conducting, transparent coatings and, more particularly, to method for efficiently forming such coatings on hollow vitreous members and to method for forming such coatings which have a very low resistivity and which are highly transmissive.

Transparent, conductive oxide films have been known for many years with one of the earlier uses being in conjunction with heated windshields. Such films were later used extensively as electrodes for electroluminescent devices and they are finding many new applications in the lighting, electronic, and energy conservation fields. As an example, in the manufacture of so-called rapid-start fluorescent lamps which are intended to be operated at reduced wattage, it is normally necessary to provide on the inner surface of the tubular envelope, a transparent conductive coating of tin oxide or indium oxide, with the fluorescent powder coating applied thereover.

The most usual technique for applying electrically conductive and optically transparent tix oxide films is to deposit such films as tenacious coatings from stannic chloride. This consists of spraying a solution of stannic chloride on a glass surface heated to 500° to 600° C. The solution normally includes alcohol to prevent undesirable fuming, and dopants to increase the conductivity of the formed coating. There are certain disadvantages to the use of this compound, including reproducibility and objectionable byproducts.

Pure stannic oxide crystals are insulators, but stannic oxide films deposited by the pyrolytic decomposition of stannic chloride from solution are conductors. The conductivity of stannic oxide films deposited by the pyrolysis of stannic chloride is believed to be due to residual chlorine atoms in the lattice. In general, the chlorine concentration decreases and the oxygen deficiency in the lattice increases with increasing decomposition temperature. Further increases in conductivity of the formed films can be obtained by doping with antimony.

It has been found that the conductivity of antimony-doped tin oxide film is at an optimum at around 1% by weight antimony trioxide doping. Such doping can reduce the conductivity of the films by as much as a factor of 50.

It is known to deposit conductive tin oxide coatings by decomposing organic tin compounds, in order to form such transparent coatings for use with fluorescent lamps. As an example, Japanese Pat. No. 50-8590, dated Apr. 5, 1975, discloses depositing conducting coatings on the interior surface of a fluorescent lamp envelope by vapor deposition of an organic tin compound, which may be doped with antimony. These coatings can also be applied by vaporizing organic tin chloride compound which may be doped with antimony, using an alcohol solution. An example of such a solution is dimethyltin dichloride mixed with triphenolantimony dichloride in methanol, as disclosed in Japanese Pat. No. 42-26637, dated Dec. 16, 1967.

In Japanese Pat. No. 50-8863 dated Apr. 8, 1975 is disclosed the formation of a transparent, conducting film by heating and evaporating organo tin compounds as a major component and a small amount of organo antimony compounds which can be added as necessary with the resulting vapor reacted on the inner surface of a glass tube to form a transparent electroconductive film of tin oxide produced by the decomposition of these materials.

As indicated hereinbefore, other systems for forming the tin oxide conducting coatings are widely used, such as spraying stannic chloride onto the glass envelope which is maintained at a temperature of 500° to 650° C. with the use of dopants such as antimony to improve the properties thereof, see Japanese Pat. Nos. 44-4211 dated Feb. 21, 1969 and Japanese Pat. No. 39-20121 dated Sept. 16, 1964.

Very highly conductive and transparent films have been made by sputtering indium-tin oxides onto a substrate, as reported in Journal Electrochemical Society, Solid-State Science and Technology, October 1972, pp. 1368–1374.

SUMMARY OF THE INVENTION

There is provided a very efficient method for forming a conductive, transparent coating on the interior surface of a vitreous tubular member. In accordance with this method, in a carrier gas comprising oxygen and exterior to the member to be coated, there is formed a vapor from a material substantially comprising organic tin halide compound having a predetermined condensation temperature and a predetermined decomposition temperature, with the temperature of the carrier gas and the formed vapor maintained between the condensation temperature and the decomposition temperature of the organic tin halide compound. The tubular member to be coated is heated to a temperature greater than the decomposition temperature of the organic tin halide compound. The heated carrier gas and formed vapor are flowed at a predetermined rate into one end portion of the heated tubular member and longitudinally passed through this member to cause a predetermined amount of the formed vapor to contact the interior surface of the heated tubular member. On contact, the vapor decomposes and forms the transparent conductive coating. The carrier gas and residual heated vapor are flowed out of the other end portion of the heated member and the carrier gas and residual vapor are then cooled to less than the condensation temperature of the organic tin halide compound in order to recover same. This method is highly efficient with respect to utilization of the coating compounds.

Very highly conductive and highly transparent coatings can be formed by forming the vapor from mixed organic tin chloride compound and organic fluoride compound, with the relative amounts of the mixed compounds being such that the weight percent of total fluorine in the mixed compounds to total tin in the next compounds is from about 0.4 to about 5. The substrate to be coated is heated to a temperature greater than the decomposition temperature of the organic tin chloride compound and a surface portion thereof is contacted with the heated vapor, in order to deposit the coating. The fluorine doping of the coating provides for a very low resistivity and a very high degree of transmission.

BRIEF DESCRIPTION OF THE DRAWINGS

For a better understanding of the invention, reference may be had to the preferred embodiments, exemplary of the invention, shown in the accompanying drawings, in which.

DESCRIPTION OF THE PREFERRED EMBODIMENTS

In practicing the present method, which is particularly adapted for forming a conductive, transparent coating on the interior surface of a vitreous tubular member of predetermined dimensions, various organic tin halide compounds can be used in forming the vapor which is decomposed to form the conductive coatings. The coatings which have the lowest resistivity and highest transmission are those utilizing a fluorine-doped tin oxide and such coatings will be considered in detail.

Figure 1:
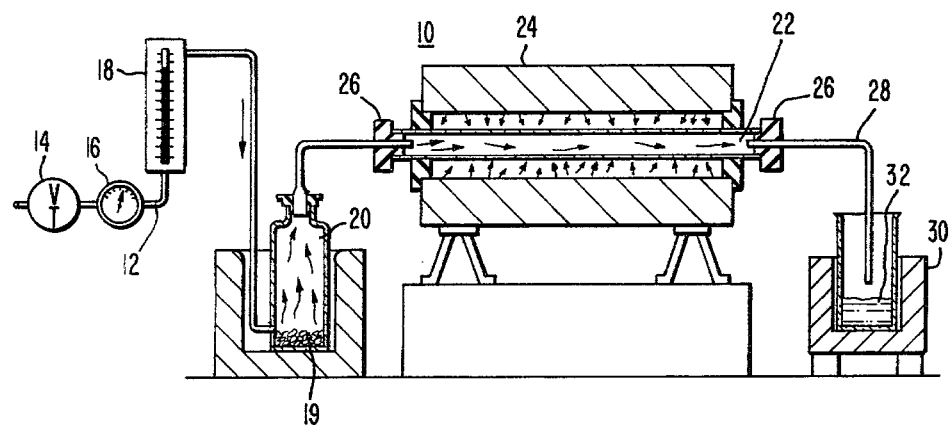
FIG. 1 is a diagrammatic view, shown partly in section, of a coating apparatus which is designed to practice the present method for applying the conductive coatings to the interior surface of a fluorescent lamp tube.

Referring to the diagrammatic showing of the apparatus 10 in FIG. 1, a carrier gas comprising oxygen, with air being preferred, is metered through a feed line 12 at a predetermined rate such as 4,700 cc per minute, expressed under standard conditions, with the pressure controlled by a suitable throttle valve 14 and gauge 16 with the flow rate monitored through a manometer 18. The preferred organic tin halide is organic tin cloride and the preferred compounds which are vaporized to form the coatings are dimethyltin dichloride and dimethyltin difluoride mixed in a molar ratio of about 0.08 mole dimethyltin difluoride per mole of dimethyltin dichloride. These mixed compounds 19 are heated in a suitable heating chamber 20 to a temperature between the boiling (or condensation) temperature of the dimethyltin dichloride and the decomposition temperature of this compound. In the case of the dimethyltin dichloride, the mixed compounds 19 are heated in the chamber 20 to a temperature between 190° C. and 350° C. Thus the temperature of the carrier gas such as air and the formed organic vapor compounds will be maintained within this temperature range.

The member to be coated is heated to a temperature greater than the decomposition temperature of the organic tin halide compound. As an example, the hollow, vitreous tubular member 22 to be coated is heated in a suitable furnace 24 to a temperature greater than the decomposition temperature of the organic tin compound which in the case of dimethyltin dichloride is a temperature greater than 350° C. As a specific example, the tubular member 22 is particularly adapted for use as a fluorescent tube and it has a length of 4 feet (1.22 m) and is formed of soda-lime silica glass having an outer diameter of 1.5 inches (3.8 cm). Both ends of the bulb 22 to be coated are provided with suitable gas passage seals 26 and the heated carrier gas and formed vapor are passed at a predetermined rate such as 4,700 cc. per minute, expressed under standard conditions, into one end portion of the heated tube 22 and are longitudinally passed through the heated tube 22 to cause a predetermined amount of the formed vapor to contact the interior surface of the heated tube where the contacting vapor decomposes and forms the transparent conducting coating. As a specific example, for this size tube and this flow rate, with the tube heated to a temperature of approximately 500°-540° C., a transparent conducting coating having a thickness of approximately 3,000 Angstroms will be formed.

The carrier gas and residual heated vapor are then flowed out of the other end portion of the heated tube 22 and through an outlet passageway 28 and into a cooling chamber 30 which cools the residual vapor to less than the condensation temperature of the organic tin halide where the residual material condenses in a reservoir 32 so that it can be reused. This system is highly efficient with substantially no loss of vapor.

Figure 2:
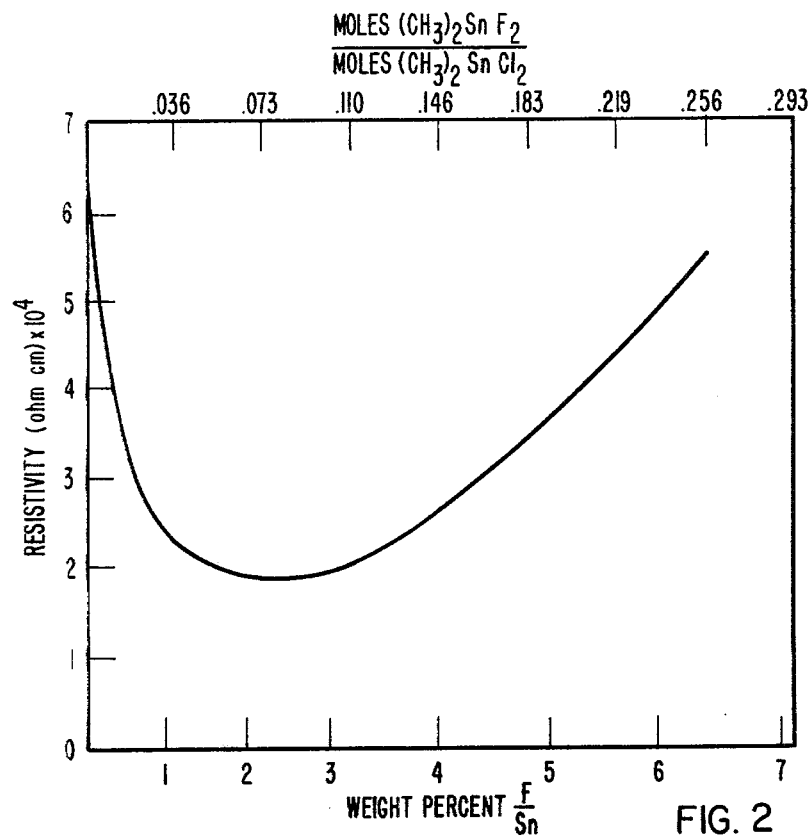
FIG. 2 is a graph of coating resistivity versus the ratio of moles of organic fluoride to moles of organic chloride (on the upper abscissa) and the weight percent fluorine to tin (on the lower abscissa) for material from which the vapor is formed for use in applying the high-performance fluorine-doped coatings.

In FIG. 2 is shown the effect of varying the molar ratio of dimethyltin difluoride to dimethyltin dichloride in the material from which the vapor is formed. The molar ratio of these compounds is shown on the upper abscissa and the weight percent of fluorine to total tin in the mixed compounds is shown on the lower abscissa. For best results, the weight percent of total fluorine in the mixed compounds to total tin in the mixed compounds should be from about 0.4 to about 5 with about 2.5% being a preferred example. Expressed in relative moles, the dimethyltin difluoride and dimethyltin dichloride from which the vapor is formed should be mixed in the respective molar ratio of from about 0.0125 to about 0.19:1, with a molar ratio of about 0.08:1 being preferred.

The high-performance fluorine-doped tin oxide coating can be used on substrates other than vitreous substrates, an example being a silicon wafer which for some applications is desired to be rendered highly conductive and transmissive. To coat such a wafer, the carrier gas which comprises oxygen has formed therein the vapor from the heated, mixed organic fluoride compound and organic tin chloride compound, with relative amounts of the mixed compounds being as specified hereinbefore. The temperature of the formed vapor is maintained between the condensation temperature and the decomposition temperature of the organic tin compound and the substrate is heated to a temperature greater than the decomposition temperature of the organic tin compound. At least one surface portion of the substrate is contacted with the formed vapor.

In the case soda-lime-silica glass is to be coated with the preferred high performance fluorine-doped tin oxide, the glass should be heated to a temperature of between 350° C. and 650° C. and, as a practical maytter, the temperature is desirably maintained between 400° C. and 600° C.

In utilizing the apparatus as shown in FIG. 1, a heating temperature of between 100° C. and 190° C. for the dimethyltin dichloride is maintained in the heating chamber 20 and this forms a pool 19 of the melted material in the bottom of the chamber 20 where it is continuously boiled. For this specific material, the carrier gas should be heated within the range of 190° C. to 350° C. during the passage through the bulb 22 in order to prevent condensation of the dimethyltin dichloride or the decomposition of the vapor. As a practical matter, the initial carrier gas temperature is desirably closer to 200° C. so that it will not be heated to over 350° C. during its longitudinal passage through the heated tube 22. In such case, the exhaust gas which exits from the coated bulb through the exhaust passageway 28 will be maintained below 350° C. and the unused vapor is readily recovered.

Figure 3:
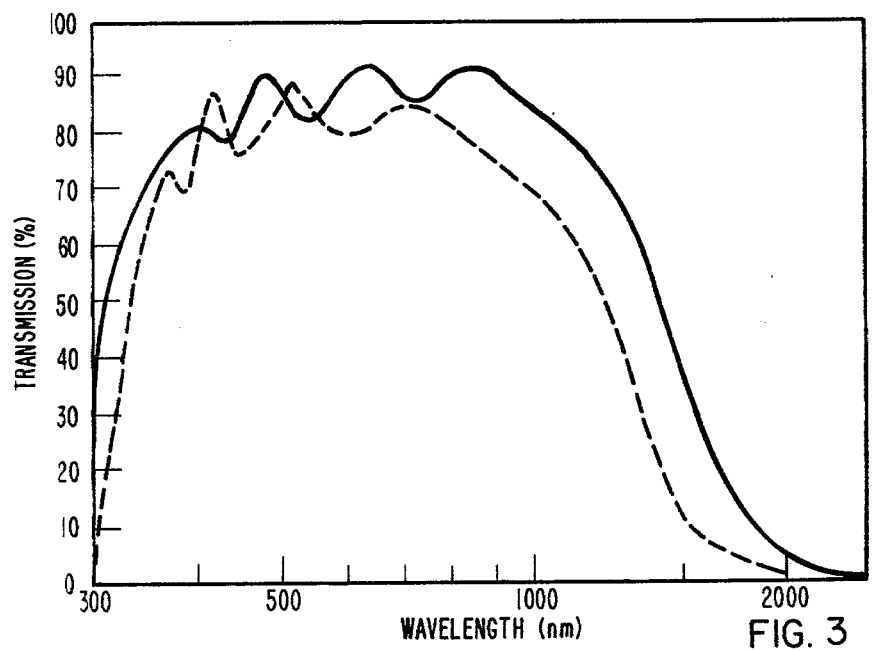
FIG. 3 is a graph of percent transmission versus wavelength comparing the performance of the fluorine-doped present coatings to very high-performance prior art coatings.

In FIG. 3 is shown a graph of percent transmission versus wavelength for the performance of the present fluorine-doped tin oxide coatings, shown in solid line, versus the performance of the best transparent conductive coatings previously reported, shown in dotted line, such as are obtained by sputtering tin-doped indium oxide, as described in the previously referenced Electrochemical Society article, October, 1972. The present fluorine doped tin oxide coatings provide a minimum resistivity of approximately $2 \times 10^{-4}$ ohm/cm. and this corresponds to approximately 7 ohms/sq. in a 3,000 Angstrom thick film. This is considerably better than is normally obtained with a conventional doped tin oxide film.

Figure 4:
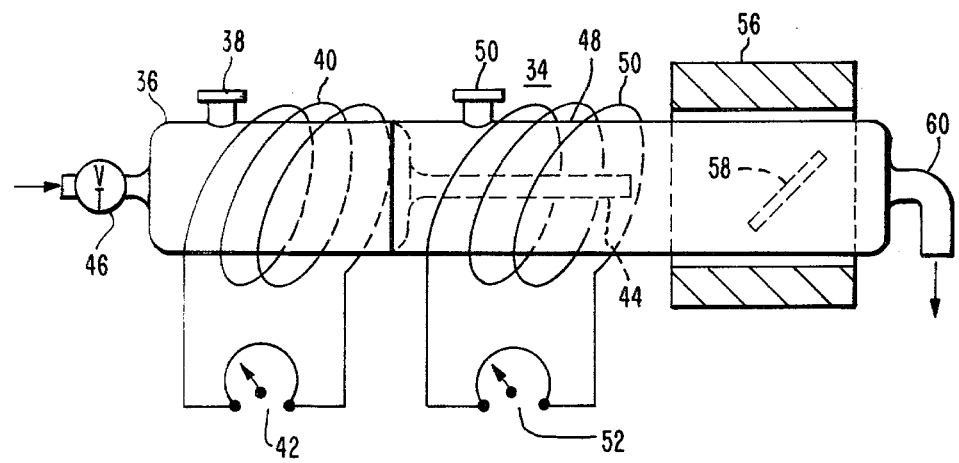
FIG. 4 is a diagrammatic showing of an alternative heating chamber for carefully controlling the relative proportions of different materials to be mixed in vapor form.

In FIG. 4 is shown an alternative heating chamber and coating apparatus 34 which is especially adapted for controlling the relative proportions of different materials in vapor form. The apparatus 34 comprises a first heating chamber 36 having an inlet 38 into which a controlled amount of one of the materials to be vaporized is introduced. As a specific example, dimethyltin difluoride is introduced into the inlet 38 and is immediately vaporized by controlling the temperature of the chamber 36 at from 316° to 327° C. by means of electrical tape-type heaters 40 which are connected to a rheostat 42. The vaporized material is forced through an elongated exit tube 44 by the carrier gas, such as air, which is introduced through an inlet and throttle value 46. A second heating chamber 48 is provided about the exit tube 44 and has an inlet 50 into which the dimethyltin dichloride is introduced, with the chamber temperature maintained at from 204° to 210° C. by the heating tape 50 and rheostat 52. Since all the coating material is immediately vaporized, the relative proportions of the different vapors are carefully controlled. The mixed vapors are passed into the furnace 56 which is heated to a temperature of from 499° to 543° C. where the vapor contacts the substrate 58 to be coated. The substrate 58 in this example can be a glass member or a silicon wafer. After coating, the carrier gas and residual vapor are passed through the furnace outlet 60 to a condenser (not shown).

While mixed dimethyltin difluoride and dimethyltin dichloride are preferred for making the high performance coatings, many other materials can be used in practicing the present efficient method, especially for coating tubes for fluorescent lamps as described hereinbefore. Following is a table of other materials which can be utilized with their respective melting points (MP) and boiling points (BP) indicated.

TABLE 1

| Boiling and Melting Points of Some Organo-Tin Halides | | |
|---|---|---|
| | MP (°C.) | BP (°C.) |
| $Me_2SnCl_2$ | 97–106 | 190 |
| $Me_3SnCl$ | 37 | 152–154 |
| $Et_2SnCl_2$ | 84 | 220 |
| $Et_3SnCl$ | 16 | 210 |
| $Ph_2SnCl_2$ | 42 | 333 |
| $Bu . SnCl_3$ | −63 | 98 |
| $(Bu^i)_2SnCl_2$ | 9 | 136 |
| ⟵⟶ | | |
| $MeSnBr_3$ | 53 | 211 |
| $Me_2SnBr_2$ | 74 | 209 |
| $Me_3SnBr$ | 27 | 165 |
| $Et_3SnBr$ | −13.5 | 97/13 mm |
| ⟵⟶ | | |
| $Me_2SnF_2$ | 42 | d < 360 |
| $Me_3SnF$ | 263 | — |
| $Et_2SnF_2$ | 229 | — |
| $Et_3SnF$ | 274 | — |
| $Ph_3SnF$ | 354 | — |
| ⟵⟶ | | |
| $MeSnI_3$ | 84 | — |
| $Me_2SnI_2$ | 43 | 228 |
| $Me_3SnI$ | 4 | 170 |
| $Et_2SnI_2$ | 45 | 240 (d) |
| $Et_3SnI$ | −34.5 | 113/13 mm |

While the preferred doping is fluorine for best performance, conventional antimony doping of the tin oxide coatings can be used by mixing organic antimony compounds with the organic tin halides in forming the coating vapor. An example of such antimony compound is triphenyl antimony dichloride and other organic antimony compounds can be substituted therefor. In forming the preferred fluorine-doped tin oxide coatings, other organic fluorine compounds can be substituted for the preferred dimethyltin difluoride, and ammonium-acid difluoride is an example. In addition, the coatings can be doped with phosphorus pentoxide and as an example, triethyl phosphite can be added to the heating chamber to achieve such doping.

We claim:

1. The method of forming a conductive, transparent coating on the interior surface of a vitreous tubular member of predetermined dimensions, which method comprises:

(a) in a carrier gas comprising oxygen and exterior to said member to be coated, forming a vapor from a material substantially comprising organic tin halide compound having a predetermined condensation temperature and a predetermined decomposition temperature, with the temperature of said carrier gas and said formed vapor maintained between the condensation temperature and the decomposition temperature of said organic tin halide compound;

(b) heating said member to be coated to a temperature greater than the decomposition temperature of said organic tin halide compound, flowing said heated carrier gas and said formed vapor at a predetermined rate into one end portion of said heated member and longitudinally through said heated member to cause a predetermined amount of said formed vapor to contact the interior surface of said heated member where the contacting vapor decomposes and forms said transparent conductive coating;

and (c) flowing said carrier gas and residual heated vapor out of the other end portion of said heated member, and cooling said carrier gas and said residual vapor to less than the condensation temperature of said organic tin halide compound to recover same.

2. The method as specified in claim 1, wherein said organic tin halide compound from which said vapor is formed is organic tin chloride compound.

3. The method as specified in claim 2, wherein said organic tin halide compound from which said vapor is formed has mixed therewith a small predetermined proportion of one of organic fluorine-containing compound or organic antimony chloride compound or organic phosphorus-containing compound.

4. The method as specified in claim 3, wherein said carrier gas is air, said vapor is formed from mixed organic tin chloride compound and organic fluoride compound, and the relative amounts of said mixed compounds being such that the weight percent of total fluorine in said mixed compounds to total tin in said mixed compounds is from about 0.4 to about 5.

5. The method as specified in claim 4, wherein said organic tin chloride compound is dimethyltin dichloride and said organic fluoride compound is dimethyltin difluoride, and said air carrier gas and said formed vapor are heated to a temperature between 190° C. and 350° C.

6. The method as specified in claim 5, wherein said dimethyltin difluoride and said dimethyltin dichloride from which said vapor is formed are mixed in the respective molar ratio of from about 0.0125:1 to about 0.19:1.

7. The method as specified in claim 6, wherein said member to be coated is heated to a temperature of between 350° C. and 650° C.

8. The method of forming a highly conductive, transparent coating on a substrate, which method comprises:
(a) in a carrier gas comprising oxygen, forming a vapor from mixed organic tin chloride compound and organic fluoride compound, the relative amounts of said mixed compounds being such that the weight percent of total fluorine in said mixed compounds to total tin in said mixed compounds is from about 0.4 to about 5, and maintaining the temperature of said formed vapor between the condensation temperature and the decomposition temperature of said organic tin chloride compound; and
(b) heating the vitreous substrate to be coated to a temperature greater than the decomposition temperature of said organic tin chloride compound and contacting at least one surface portion of said heated substrate with said formed vapor.

9. The method of forming a highly conductive, transparent coating on a substrate, which method comprises:
(a) in a carrier gas comprising oxygen, forming a vapor from mixed dimethyltin dichloride and dimethyltin difluoride, the relative amounts of said mixed compounds being such that the weight percent of total fluorine in said mixed compounds to total tin in said mixed compounds is from about 0.4 to about 5, and maintaining the temperature of said formed vapor between 190° C. and 350° C.; and
(b) heating the vitreous substrate to be coated to a temperature greater than 350° C. and contacting at least one surface portion of said heated substrate with said formed vapor.

10. The method as specified in claim 9, wherein said substrate is a vitreous transparent material, and the temperature of said substrate when contacted by said vapor is between 350° C. and 650° C.

11. The method as specified in claim 9, wherein air carrier gas is passed through a heated chamber containing dimethyltin difluoride and dimethyltin dichloride mixed in the respective molar ratio of from about 0.0125:1 to about 0.19:1 and heated to a temperature in the range of between 190° C. and 350° C. to from said vapor; and
said carrier gas and said vapor are maintained within said temperature range and are passed longitudinally through a hollow vitreous tubular member which is heated to a temperature greater than 350° C. to deposit said coating on the interior surface of said tubular member.

12. The method as specified in claim 11, wherein said hollow vitreous tubular member is heated to a temperature of between 350° C. and 650° C.

* * * * *